(12) United States Patent
Lawrence et al.

(10) Patent No.: US 7,015,835 B2
(45) Date of Patent: Mar. 21, 2006

(54) IMPOSING AND RECOVERING CORRELITHM OBJECTS IN CONJUNCTION WITH TABLE LOOKUP

(75) Inventors: P. Nick Lawrence, Dallas, TX (US); Douglas J. Matzke, Plano, TX (US); Irvin R. Jackson, Jr., II, Los Angeles, CA (US)

(73) Assignee: Lawrence Technologies, LLC, Dallas, TX (US)

( * ) Notice: Subject to any disclaimer, the term of this patent is extended or adjusted under 35 U.S.C. 154(b) by 41 days.

(21) Appl. No.: 10/803,573

(22) Filed: Mar. 17, 2004

(65) Prior Publication Data

US 2006/0017590 A1    Jan. 26, 2006

(51) Int. Cl.
*H03M 7/00* (2006.01)

(52) U.S. Cl. .......................... 341/50; 341/87
(58) Field of Classification Search ................ 341/50, 341/51, 87
See application file for complete search history.

(56) References Cited

U.S. PATENT DOCUMENTS

| | | | | |
|---|---|---|---|---|
| 4,891,823 A | * | 1/1990 | Cole | 375/242 |
| 5,216,750 A | * | 6/1993 | Smith | 706/18 |
| 5,300,931 A | * | 4/1994 | Lindsay et al. | 341/106 |
| 5,883,981 A | * | 3/1999 | Li et al. | 382/253 |
| 5,991,333 A | | 11/1999 | Rice | 375/130 |
| 6,157,611 A | | 12/2000 | Shanbhag | 370/208 |
| 6,272,168 B1 | | 8/2001 | Lomp et al. | 375/222 |
| 6,621,854 B1 | | 9/2003 | Rice | 375/142 |
| 6,674,712 B1 | | 1/2004 | Yang et al. | 370/208 |
| 2001/0031639 A1 | | 10/2001 | Mikipaa | 455/450 |
| 2003/0147478 A1 | | 8/2003 | Chang | 375/340 |
| 2003/0161286 A1 | | 8/2003 | Li | 370/335 |
| 2003/0193914 A1 | | 10/2003 | Lomp et al. | 370/335 |
| 2003/0202620 A1 | | 10/2003 | Stevenson | 375/334 |
| 2004/0208315 A1 | * | 10/2004 | Kilbank | 380/37 |

OTHER PUBLICATIONS

U.S. Pending Appl. No. 10/634,490, entitled "*Representing and Manipulating Correlithm Objects Using Quantum Objects*", by P. Nick Lawrence, et al., 59 total pages, Aug. 5, 2003.

U.S. Pending Patent Application, entitled "*Imposing and Recovering Correlithm Objects*", by Douglas J. Matzke, et al., 38 total pages, Mar. 10, 2004.

* cited by examiner

*Primary Examiner*—Howard L. Williams
(74) *Attorney, Agent, or Firm*—Baker Botts L.L.P.

(57) ABSTRACT

Encoding bits includes receiving a bit set to encode. An encoding lookup table associates correlithm objects of a space with bit sets. The space refers to an N-dimensional space, a correlithm object refers to a point of the space. The correlithm object corresponding to the received bit set is identified. The received bit set is encoded as the identified correlithm object. The identified correlithm object is imposed to encode the received bit set and subsequently decoded with table lookup using the reverse process.

11 Claims, 1 Drawing Sheet

IMPOSING AND RECOVERING CORRELITHM OBJECTS IN CONJUNCTION WITH TABLE LOOKUP

GOVERNMENT FUNDING

The U.S. Government may have certain rights in this invention as provided for by the terms of SBIR contract No. F30602-03-C-0051 awarded by the United States Air Force.

TECHNICAL FIELD OF THE INVENTION

This invention relates generally to the field of correlithm objects and more specifically to imposing and recovering correlithm objects in conjunction with table lookup.

BACKGROUND OF THE INVENTION

Tokens may be used to provide interaction for agents in a shared resource such as a shared state space or medium. Concurrent tokens may be used to provide simultaneous interaction. An encoding lookup table may be used to associate information with tokens. Known techniques typically utilize precisely orthogonal tokens that are independent of each other when summed together according to vector math principles. The use of precisely orthogonal tokens, however, is not efficient in certain situations. It is generally desirable to use efficient techniques in certain situations.

SUMMARY OF THE INVENTION

In accordance with the present invention, disadvantages and problems associated with previous techniques for representing concurrent tokens in a shared resource may be reduced or eliminated.

According to one embodiment of the present invention, encoding bits includes receiving a bit set to encode. An encoding lookup table associates correlithm objects of a space with bit sets. The space refers to an N-dimensional space, a correlithm object refers to a point of the space. The correlithm object corresponding to the received bit set is identified. The received bit set is encoded as the identified correlithm object. The identified correlithm object is imposed to encode the received bit set.

Certain embodiments of the invention may provide one or more technical advantages. A technical advantage of one embodiment may be that correlithm objects and an encoding lookup table may be used to represent more information for each given token.

Certain embodiments of the invention may include none, some, or all of the above technical advantages. One or more other technical advantages may be readily apparent to one skilled in the art from the figures, descriptions, and claims included herein.

BRIEF DESCRIPTION OF THE DRAWINGS

For a more complete understanding of the present invention and its features and advantages, reference is now made to the following description, taken in conjunction with the accompanying drawings, in which.

DETAILED DESCRIPTION OF THE DRAWINGS

Figure 1:
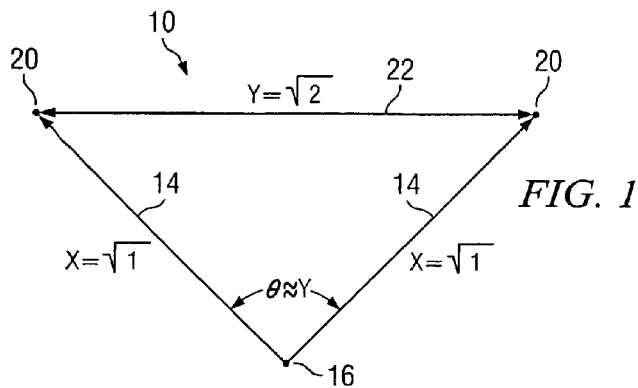
FIG. 1 is a diagram illustrating example random correlithm objects that may be used to form nearly orthogonal vectors.
Figure 2:
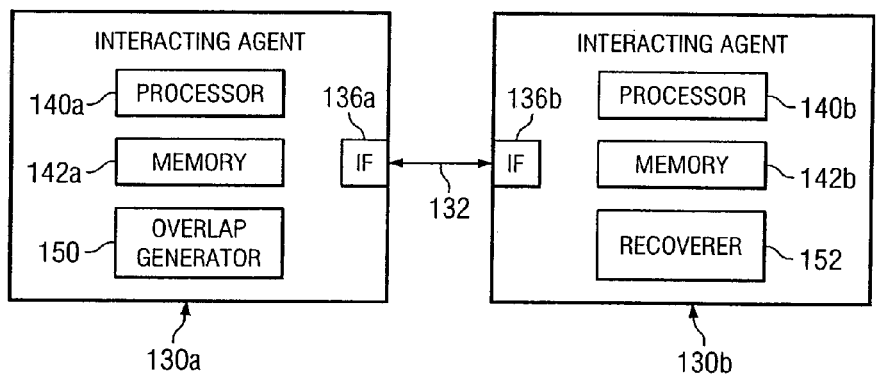
FIG. 2 is a block diagram illustrating one embodiment of a system for imposing and recovering correlithm objects used as correlithm object tokens.
Figure 3:
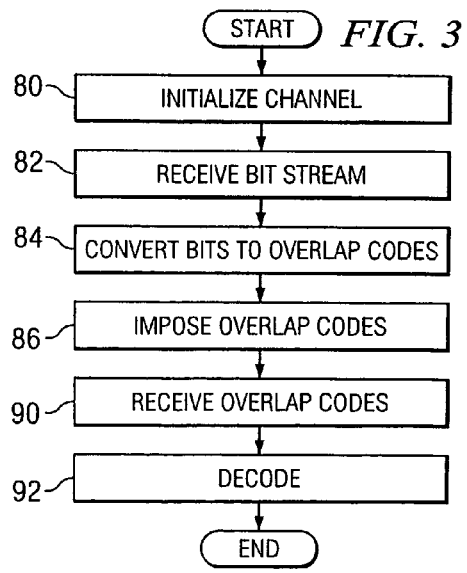
FIG. 3 is a flowchart illustrating one embodiment of a method for imposing and recovering correlithm objects that may be used with the system of FIG. 2.

Embodiments of the present invention and its advantages are best understood by referring to FIGS. 1 through 3 of the drawings, like numerals being used for like and corresponding parts of the various drawings.

FIG. 1 is a diagram 10 illustrating example randomly generated correlithm objects that may be used to form nearly orthogonal vectors. According to one embodiment, two or more correlithm objects may be imposed on and recovered from the same correlithm object space representing a shared resource such as a shared medium. An encoding lookup table may be used with correlithm objects to encode the information. The encoding lookup table may include entries, where each entry associates specific information with one or more correlithm objects (CO) used as CO tokens. To encode information, correlithm objects associated with the information may be imposed.

In general, a correlithm object comprises a point of a correlithm object space. A correlithm object may be used as a representation of a token or a code. According to one embodiment, a correlithm object may represent a point of a generalized M-dimensional sub-space S of a particular N-space, where $0 \leq M \leq N$. A generalized sub-space comprises a sub-space for which the participation of each dimension from the N-space has been defined, where participation describes the degree to which a dimension is contained within the sub-space. A dimension may be completely contained within a sub-space, fractionally contained within the sub-space, or completely outside of the sub-space. Other embodiments of correlithm object may be used without departing from the scope of this disclosure.

A correlithm object may have any suitable number of entries. For example, a correlithm object may include at least twenty, such as thirty, one hundred, one thousand, or ten thousand entries, for example, between one hundred and one thousand entries. An entry may include real numbers, complex numbers, or other suitable values. According to one embodiment, an entry may represent any suitable number of bits of significance, where each bit of significance is represented within one or more numbers such as binary, real, or complex numbers. In this document, the term "each" refers to each of at least a subset of the identified items.

A random correlithm object comprises a random point of a correlithm object space. Any suitable distribution of correlithm objects may be used. According to one embodiment, uniformly distributed random correlithm objects may be used. As the number of dimensions of space S increases, randomly selected correlithm objects exhibit standard metrics. A standard metric refers to a standardized distance metric such as a standard distance, a standard radius, a standard corner—corner distance, a standard corner-point distance, or other suitable standardized distance metric.

Standard Distance and Standard Radius

According to the illustrated embodiment, random points 20 represent randomly selected correlithm objects with N dimensions or cells. Vectors 14 originate at a center point 16, and each vector 14 is directed at a random point 20. Center point 16 may represent the average of many correlithm objects, and is typically the midpoint of the correlithm object space, the correlithm object distribution, or both. According to one embodiment, each vector 14 may represent a state of an agent such as a process or device.

"Standard distance" refers to the distance between random points 20, and "standard radius" refers to the distance between center point 16 and a random point 20. Random points 20 tend to lie at an approximately standard distance from one another, and the distance between a random point 20 and center point 16 approaches an approximately standard radius. The standard radius is typically shorter than the standard distance by approximately $$\sqrt{1/2}.$$

For example, the standard radius for a unit cube with a standard distance of $$\sqrt{N/6}$$

is approximately $$\sqrt{N/12}.$$

This standard radius is statistical, and has a constant standard deviation of approximately $$\sqrt{1/60}$$

for large N.

According to the illustrated embodiment, random points 20 lie at a normalized standard radius $X=\sqrt{1}$ of approximately unit length from center point 16 and at a normalized standard distance $Y=\sqrt{2}$ from each other.

Standard Metrics for a Bounded Space

"Standard corner—corner distance" refers to the distance between any two randomly chosen corners of a bounded space. For example, the corners of a unit N-cube typically have coordinates values that are binary values (0 or 1). The standard corner—corner distance may be calculated as the Cartesian distance, which is equivalent to the square root of the Hamming distance, yielding approximately $$\sqrt{N/2}.$$

The standard corner—corner distance is statistical and has a constant standard deviation of approximately $$\sqrt{1/2}^3 \approx 0.3535$$

for large N.

"Standard corner-point distance" refers to the standard distance between a randomly chosen corner and a random point 20 inside of a bounded space. For example, the standard corner-point distance for a unit N-cube is approximately the value of $$\sqrt{N/3},$$

which is approximately twice the standard radius between center point 16 of the unit N-cube and a random corner of approximately $$\sqrt{\frac{N}{12}}.$$

The standard corner-point distance may be generalized for any space, and may be slightly different depending on the distribution of random points 20 within the space compared to the size of the bounding space. The standard corner-point distance is statistical and has a constant standard deviation that is independent of N.

Nearly Orthogonal Vectors

Vector 14 originates from center point 16 and is directed to a random point 20, where angle θ is the angle between vectors 14. The inner product of vectors 14 is approximately zero, that is, vectors 14 are nearly orthogonal according to the Pythagorean Theorem. According to one embodiment, vectors 14 may be nearly orthonormal, that is, have approximately unit lengths and be nearly orthogonal. Precisely orthogonal vectors have a separation of exactly 90°, that is, the inner product of the vectors is substantially equal to zero. Nearly orthogonal vectors may have a statistical variation of the separation 90°±v, where typically the statistical variation v<5°, but can be as much as v<15°.

The number of dimensions of random points 20 may be used to control the standard deviation of angle θ. For example, random points 20 with one hundred entries may have a standard deviation of approximately four degrees, random points 20 with one thousand entries may have a standard deviation of approximately one degree, and random points 20 with three thousand entries may have a standard deviation of less than one degree. Accordingly, vectors 14 may become naturally more orthogonal as the number of dimensions increases. The number of dimensions may be, for example, greater than 100 dimensions.

Random points 20 formed into vectors 14 may themselves be considered to be nearly orthogonal. If the space is symmetric around zero, then center point 16 is located at zero. Under these conditions, the representation for random point 20 is identical to the representation for vector 14, which may facilitate the dual manner of computing for points or vectors without any translation. The expected values for the standard angle and inner product metric are independent of N, but statistical, and the normalized standard deviation is dependent on 1/N, resulting in more closely orthogonal points 20 for larger N.

Normalization with Standard Radius

Normalization yields nearly orthonormal random points 16. The standard metrics are intrinsic for correlithm object distributions, so any suitable standard metric may be used for normalization. For example, the standard radius may be used to normalize the metrics. Normalized metrics are not dependent on N and approximate the square root of a small integer value. For a unit cube, the normalized value for the standard radius is approximately 1, for the expected value of the standard distance is approximately √2, for the standard corner-point distance is approximately √4, and for the standard corner—corner distance is approximately $\sqrt{6}$. The normalized values may be generalized for any bounded space, and the standard distance remains at approximately $\sqrt{2}$ due to the Pythagorean Theorem.

Normalized standard deviations have the form $$\sqrt{x/N},$$

where x is some small constant value. For example, for a unit cube, the normalized deviation of standard distance is $$\sqrt{7/10N}.$$

Therefore, as N increases the normalized standard deviations shrinks to 0.

Recoverable Correlithm Objects

Random points 20 representing correlithm objects may be imposed on and recovered from the same space S. "Imposing" points on a space may refer to expressing the points as a combined point in the space, and "recovering" points from the space may refer to retrieving the individual points from the combined point. For example, a space may include a number K of correlithm objects represented by points $P_1, \ldots P_i, \ldots p_k$, where K>1. Points $p_i$ may be imposed on space S to yield a single point P of space S. Points $p_i$ may be imposed according to any suitable technique. For example, points $p_i$ may be imposed by performing an imposing operation such as summation on a dimension-by-dimension basis, which is equivalent to vector addition.

An imposed point $p_i$ may be recovered by comparing point P to the point $p_i$ using any suitable technique. For example, an imposed point $p_i$ may be recovered by performing a recovery operation on imposed point $p_i$ and combined point p, such as calculating a metric such as a Cartesian distance or an inner product.

Imposed points $p_i$ share a certain amount of available discrimination D of space S used to recover the points, where D may be measured in bits. According to one embodiment, available discrimination D in an N-dimensional space is approximately N/σ bits, where σ is approximately $\sqrt{7/120}$ the standard deviation of the expected distance between two points $p_i$ of an N-dimensional unit cube. If K points $p_i$ are imposed on space S, then an available discrimination for a point comprising D/K bits of information may be available to discriminate each of the imposed points $p_i$.

Typically, in physical implementations of imposed and recovered points $p_i$, there may be a noise floor. If D/K is greater than the noise floor, then each of the imposed points $p_i$ may be individually recovered. The points $p_i$ may still be recoverable to a decreasing degree as D/K equals or drops below the noise floor. If two points $p_i$ have no dimensions in common, then they may be completely recoverable. If two points $p_i$ have at least one dimension in common, then the points $p_i$ may not be completely recoverable at D/K bits.

The recoverability of correlithm objects may allow for the useful representation of states by correlithm objects. According to one embodiment, a correlithm object may represent a state of a state space for an agent, where an agent may comprise, for example, a process in memory or a physical device. One or more agents may each have one or more unique correlithm objects that represent states for the agent, and the correlithm objects may constitute a private state machine space for the agent. The spaces may be disjoint or overlapping. Two or more agents may execute concurrently within the same space if random correlithm object tokens are globally unique for each state machine space.

According to one embodiment, the recoverability of correlithm objects may provide for correlithm object (CO) tokens, which may be used as overlap codes. As discussed above, randomly generated correlithm objects are nearly orthogonal, in particular as the number of dimensions N increases. For example, the number of dimensions may be relatively large such as greater than 1000. Accordingly, randomly generated correlithm objects may be used as nearly orthogonal tokens. As N increases, the tokens naturally become more orthogonal, thus more closely approximating the characteristics of precisely orthogonal tokens. The less orthogonal the tokens, the more inter-symbol interference occurs between simultaneous agents during the concurrent use of a shared resource.

According to one embodiment, a correlithm object token may comprise a correlithm object that has D bits represented by N cells. For unit cube, the number of bits-per-dimension may be approximately four bits per dimension such as 4.14 bits per dimension or typically less depending on the resolution per dimension. Each cell value may comprise a randomly selected value, for example, a binary value, a complex number, or a real number of the appropriate resolution. The cell values may have specific ranges and distributions. For example, the cell values may be symmetric around, for example, zero. Different distribution spaces may be statistically equivalent, which may facilitate implementation of encoding and recovery.

Correlithm objects may provide for a greatly increased number of available tokens. For an N-dimensional space, only N precisely orthogonal tokens exist. Random correlithm objects, however, may be readily generated to produce nearly orthogonal tokens. Techniques may be implemented to select random correlithm objects that produce nearly orthogonal tokens with a narrower standard deviation of inner angle. For example, tokens may be pre-screened using, for example, N-M-J codes. As another example, unacceptable tokens may be filtered to discard poor candidates to yield a narrowed distribution set, which may produce improved orthogonality.

Modifications, additions, or omissions may be made to the example without departing from the scope of the invention. For example, the distances illustrated in FIG. 1 have been normalized using the standard radius X. Different distances may be obtained using other normalizing factors. As another example, vectors 14 may have angles θ other than 90°.

FIG. 2 is a block diagram illustrating one embodiment of a system 200 for imposing and recovering correlithm objects used as CO tokens. According to the illustrated embodiment, system 200 includes interacting agents 130 coupled by one or more shared resources such as a memory system or electromagnetic or equivalent channels 132 as shown. A source agent 130*a* imposes a correlithm object by superimposing information into a shared medium using a CO token as an overlap code. Detector agent 130*b* recovers the correlithm object using a matching CO token as a matching detector code. System 200 may impose and recover correlithm objects to impose CO tokens in a shared resource in order to compute, communicate, store, or any other combination of the preceding. As an example, source agent 130*a* may communicate information across a distance to detector agent 130b. As another example, source agent 130a may store information for a duration for later retrieval by detector agent 130b.

An interacting agent 130 may comprise any agent operable to interact locally or remotely with another agent, for example, a computer, a personal digital assistant, a cellular telephone, a mobile handset, a satellite, a process, a base station, or other agent. According to the illustrated embodiment, interacting agents 130 each include an interface (IF) 136, one or more processors 140, and a memory 142. Interacting agents 130 may, however, include more, fewer, or other hardware, software, or other structure for computation, communication, storage, or any combination of the preceding. Although this example system 200 includes agents 130, system 200 may instead include any other agent operable to impose a correlithm object or any other agent operable to recover a correlithm object.

"Interface" refers to any suitable structure of a device operable to receive input for the device, send output from the device, or both, and may comprise one or more ports. "Processor" refers to any suitable device operable to function according to instructions. A processor may comprise, for example, a personal computer, work station, network computer, wireless telephone, personal digital assistant, one or more microprocessors, other suitable processing device, or any combination of the preceding. "Memory" refers to any structure operable to store data. A memory may comprise Random Access Memory (RAM), Read Only Memory (ROM), a magnetic drive, a disk drive, a Compact Disk (CD) Drive, a Digital Video Disk (DVD) drive, removable media storage, any other suitable data storage device, or a combination of the preceding.

Source agent 130a includes an overlap generator 150. Overlap generator 150 operates to impose a correlithm object by representing information using a CO token as an overlap code. Detector agent 130b includes a code recoverer 152. Recoverer 152 operates to recover a correlithm object by detecting information using a matching CO token as a detector code.

According to one embodiment, vectors may be used to represent tokens. For example, p random vectors $X_i$ of length N, i=1, ..., p may represent a set of p tokens x, and q random vectors $Y_j$ of length N, j=1, ..., q may represent a set of q tokens y. Concurrent tokens x and y may be imposed by summing their corresponding $X_i$ and $Y_j$ vectors to yield a combined state Z with elements $Z[k]=(X_i[k]+Y_j[k])$, for k=1, ... N. To recover token x, the Cartesian distance (or inner product) of Z with each of the $X_i$ may be computed. The recovered token x is ith vector that has the smallest distance metric (or largest inner product) A similar procedure may be used to recover token y.

According to one embodiment, the length of an overlap code may be less than or equal to the dimensional length. If less than, a binary mask may be used. The mask may be integrated into a recovery token table or stored separately to allow the same codes to be shared by source agent 130a.

A token assignee that is assigned a token may comprise a logical channel 132 or a number of simultaneous users. A user may refer to a user account for an interaction service or to interacting agent 130 itself. A user may be identified by a user identifier comprising, for example, a logical name, other suitable identifier, or any combination of the preceding.

According to one embodiment, CO tokens may be used with table lookup techniques. According to the embodiment, memory 142a of source agent 130a may include an encoding lookup table, and memory 142b of detector agent 130b may include a decoding lookup table. The encoding lookup table may include entries for encoding information such as a specific bit pattern. Each entry may associate information with one or more correlithm objects, where each correlithm object is used as a token. One or more correlithm objects may be imposed to encode associated information, which may then be communicated or stored. The one or more correlithm objects may be recovered to decode the information. The decoding lookup table may include entries, where each entry may associate one or more recovered correlithm objects with information. Accordingly, an encoding lookup table may allow for more than one token per channel.

According to the embodiment, a token assignee may be assigned more than one token to represent more information. The amount of information that may be represented may be described by $B=\log_2(T)$, where B represents the bits per token and T represents the number of unique tokens per user. For example, if each user has T=256 tokens, then each user can transmit $8=\log_2(256)$ bits per code. In contrast, traditional techniques encode one bit into an N bit binary code or its binary inverse. CO tokens are not restricted to only binary values as is with traditional codes.

Alterations or permutations such as modifications, additions, or omissions may be made to system 200 without departing from the scope of the invention. System 200 may have more, fewer, or other modules. Moreover, the operations of system 100 may be performed by more, fewer, or other modules. For example, the operations of overlap generator 150 may be performed by more than one module. Additionally, operations of system 200 may be performed using any suitable logic comprising software, hardware, other logic, or any suitable combination of the preceding.

FIG. 3 is a flowchart illustrating one embodiment of a method for imposing and recovering correlithm objects that may be used with system 200 of FIG. 2. According to the embodiment, overlap generator 50 of source agent 130a may convert bits into overlap codes. Recovery agent 52 of detector agent 130b decodes the overlap codes using matching codes.

The method begins at step 80, where channel 132 between interacting agents 130 is initialized. During initialization, codes of one or more tokens may be shared between interacting agents 130. Bits are received at overlap generator 150 of source agent 30a at step 82. Overlap generator 150 converts the bits to overlap codes at step 84. One or more bits from the bit stream may be converted into a unique code using the code table lookup. The overlap codes are imposed into a shared resource at step 86. According to one embodiment, the results from some or all of the source agents 130a may be summed explicitly or naturally by the shared resource to produce overall equivalent values in the space. A normalization process may be explicitly or automatically performed on the sum, but normalization may not be required.

The combined overlap codes are received by recovery agent 52 of detector agent 130b at step 90. The overlap codes are detected at step 92. According to one embodiment, metrics such as the Cartesian distance, the inner product, other suitable operation, or any combination of the preceding may be computed for each of the detector codes. Time delayed sliding windows of these operations may also be performed. After decoding the overlap codes to produce the original information bits, the method terminates.

Alterations or permutations such as modifications, additions, or omissions may be made to the method without departing from the scope of the invention. The method may include more, fewer, or other steps. Additionally, steps may be performed in any suitable order without departing from the scope of the invention.

Certain embodiments of the invention may provide one or more technical advantages. A technical advantage of one embodiment may be that correlithm objects may be used to generate nearly orthogonal overlap codes. Typically, larger numbers of nearly orthogonal overlap codes can be generated than precisely orthogonal codes.

Although an embodiment of the invention and its advantages are described in detail, a person skilled in the art could make various alterations, additions, and omissions without departing from the spirit and scope of the present invention as defined by the appended claims.

What is claimed is:

1. A method for encoding one or more bits, comprising:
   receiving a bit set to encode;
   accessing an encoding lookup table associating a plurality of correlithm objects with a plurality of bit sets, a correlithm object of the plurality of correlithm objects corresponding to a bit set of the plurality of bit sets, each correlithm object comprising a point of an N-dimensional space, each correlithm object randomly generated by randomly selecting one or more values for one or more entries of the each correlithm object, each bit set comprising one or more bits;
   identifying the correlithm object corresponding to the received bit set;
   encoding the received bit set as the identified correlithm object;
   imposing the identified correlithm object;
   recovering the identified correlithm object;
   accessing a decoding lookup table associating the recovered correlithm object with the received bit set; and
   determining the received bit set associated with the recovered correlithm object according to the decoding lookup table.

2. The method of claim 1, further comprising:
   using the plurality of correlithm objects as a plurality of tokens; and
   assigning one or more tokens of the plurality of tokens to a token assignee.

3. The method of claim 1, wherein imposing the identified correlithm object further comprises performing a computation using the identified correlithm object.

4. A system for encoding one or more bits, comprising:
   means for receiving a bit set to encode;
   means for accessing an encoding lookup table associating a plurality of correlithm objects with a plurality of bit sets, a correlithm object of the plurality of correlithm objects corresponding to a bit set of the plurality of bit sets, each correlithm object comprising a point of an N-dimensional space, each correlithm object randomly generated by randomly selecting one or more values for one or more entries of the each correlithm object each bit set comprising one or more bits;
   means for identifying the correlithm object corresponding to the received bit set;
   means for encoding the received bit set as the identified correlithm object; and
   means for imposing the identified correlithm object.

5. A system for encoding one or more bits, comprising:
   a memory operable to:
      store a received bit set to encode; and
      store an encoding lookup table associating a plurality of correlithm objects with a plurality of bit sets, a correlithm object of the plurality of correlithm objects corresponding to a bit set of the plurality of bit sets, each correlithm object comprising a point of an N-dimensional space, each correlithm object randomly generated by randomly selecting one or more values for one or more entries of the each correlithm object, each bit set comprising one or more bits; and
   one or more processors coupled to the memory and operable to:
      identify the correlithm object corresponding to the received bit set;
      encode the received bit set as the identified correlithm object;
      impose the identified correlithm object;
      recover the identified correlithm object;
      access a decoding lookup table associating the correlithm object with the received bit set; and
      determine the received bit set associated with the recovered correlithm object according to the decoding lookup table.

6. The system of claim 5, the one or more processors further operable to:
   use the plurality of correlithm objects as a plurality of tokens; and
   assign one or more tokens of the plurality of tokens to a token assignee.

7. The system of claim 5, the one or more processors further operable to impose the identified correlithm object by performing a computation using the identified correlithm object.

8. A method for encoding one or more bits, comprising:
   receiving a bit set to encode;
   accessing an encoding lookup table associating a plurality of correlithm objects with a plurality of bit sets, a correlithm object of the plurality of correlithm objects corresponding to a bit set of the plurality of bit sets, each correlithm object comprising a point of an N-dimensional space, each bit set comprising one or more bits, the plurality of correlithm objects randomly generated by randomly selecting one or more values for one or more entries of a correlithm object;
   using the plurality of correlithm objects as a plurality of tokens;
   assigning one or more tokens of the plurality of tokens to a token assignee;
   identifying the correlithm object corresponding to the received bit set;
   encoding the received bit set as the identified correlithm object;
   imposing the identified correlithm object, the identified correlithm object imposed to perform a computation using the identified correlithm object;
   recovering the identified correlithm object;
   accessing a decoding lookup table associating the recovered correlithm object with the received bit set; and
   determining the received bit set associated with the recovered correlithm object according to the decoding lookup table.

9. Logic for encoding one or more bits, the logic embodied in a medium and operable to:
   receive a bit set to encode;
   access an encoding lookup table associating a plurality of correlithm objects with a plurality of bit sets, a correlithm object of the plurality of correlithm objects corresponding to a bit set of the plurality of bit sets, each correlithm object comprising a point of an N-dimensional space, each correlithm object randomly generated by randomly selecting one or more values for one or more entries of the each correlithm object, each bit set comprising one or more bits;

identify the correlithm object corresponding to the received bit set;
encode the received bit set as the identified correlithm object;
impose the identified correlithm object;
recover the identified correlithm object;
access a decoding lookup table associating the recovered correlithm object with the received bit set; and
determine the received bit set associated with the recovered correlithm object according to the decoding lookup table.

10. The logic of claim 9, further operable to
use the plurality of correlithm objects as a plurality of tokens; and
assign one or more tokens of the plurality of tokens to a token assignee.

11. The logic of claim 9, further operable to impose the identified correlithm object to encode the received bit set by performing a computation using the identified correlithm object.

* * * * *